(12) United States Patent
England et al.

(10) Patent No.: US 7,065,607 B2
(45) Date of Patent: Jun. 20, 2006

(54) SYSTEM AND METHOD FOR IMPLEMENTING A COUNTER

(75) Inventors: Paul England, Bellevue, WA (US); Marcus Peinado, Bellevue, WA (US)

(73) Assignee: Microsoft Corporation, Redmond, WA (US)

(*) Notice: Subject to any disclaimer, the term of this patent is extended or adjusted under 35 U.S.C. 154(b) by 529 days.

(21) Appl. No.: 10/185,055

(22) Filed: Jun. 28, 2002

(65) Prior Publication Data

US 2004/0003189 A1 Jan. 1, 2004

(51) Int. Cl.
*G06F 12/06* (2006.01)

(52) U.S. Cl. .......................... 711/103; 377/26

(58) Field of Classification Search ................ 711/103, 711/155, 156; 377/26
See application file for complete search history.

(56) References Cited

U.S. PATENT DOCUMENTS

| | | | | |
|---|---|---|---|---|
| 4,947,410 A | * | 8/1990 | Lippmann et al. | ............. 377/26 |
| 5,381,452 A | * | 1/1995 | Kowalski | ...................... 377/26 |
| 5,892,900 A | | 4/1999 | Ginter et al. | ................ 713/200 |
| 6,084,935 A | * | 7/2000 | Mather | .......................... 377/33 |
| 6,249,562 B1 | * | 6/2001 | Wells | ............................ 377/26 |
| 6,687,325 B1 | * | 2/2004 | Wells | ............................ 377/26 |

* cited by examiner

*Primary Examiner*—Kevin L. Ellis
(74) *Attorney, Agent, or Firm*—Woodcock Washburn LLP

(57) ABSTRACT

A counter is provided which can be implemented in flash memory allowing longer life through fewer erasures. The counter is incremented using a method that minimizes bit transitions from 1 to 0. In one embodiment, the counter is implemented in m+n bits. The bits of the counter are grouped into a binary portion of the counter of m bits and a unary portion of the counter of n bits. In order to increment the counter, the unary portion of the counter is incremented first. When the unary portion of the counter reaches a specific value, the binary portion of the counter is incremented. This limits 1 to 0 bit transitions and allows a large range of unique values to be read from the counter. In another embodiment, two unary counters are formed, which dynamically change in size as the counter is incremented.

12 Claims, 4 Drawing Sheets

SYSTEM AND METHOD FOR IMPLEMENTING A COUNTER

FIELD OF THE INVENTION

The present invention relates to counters, and more specifically, to the use of a counter in such a way as to reduce certain bit transitions in the cluster.

BACKGROUND OF THE INVENTION

In a computer system, a counter holds data and can increment and provide the value of the data upon request. For example, a counter may be implemented in a register which holds numbers from zero to 255. Upon request, the counter increments the number by 1, mod 255. Upon request, the counter reports the value of the number in the register. Depending on the use of the counter, different increments may be preferable. "Increments" may be mathematical operations other than addition; for example, a multiplication may be performed. Generally, a counter reports on counter data and allows the modification of the counter data in a predetermined way.

It may be desirable in some contexts to implement a counter in hardware in a computer system in order to present barriers to adversaries attempting to modify the counter. Counters have been implemented in flash memory. However a limitation of flash memory is that when data in flash memory is changed, any bit transitions from 1 to 0 will cause flash memory to need to be erased and rewritten. If all bits remain the same or transition from 0 to 1, then no erasure is required for the change. Conventionally, flash memory has a limited lifespan of 10,000 to 1,000,000 erasures.

Users prefer computer system components to have a long life. Additionally, while some portions of a computer system may be replaceable, for security reasons, a flash counter may be made more difficult or impossible to exchange, in order to combat improper use by an adversary. Thus, the life of a counter is even more important. There is a need for a flash memory counter with an improved lifespan.

Thus, there is a need for a counter implementation that properly addresses and satisfies heretofore unfilled needs in the art.

SUMMARY OF THE INVENTION

In view of the foregoing, the present invention provides systems and methods for an improved counter that improves counter longevity. The present invention provides a counter that reduces bit transitions from 1 to 0.

In one embodiment, an (m+n)-bit memory is provided. m bits of memory are used for a binary portion of a counter, and n bits of memory are used for a unary portion of the counter. The unary portion of the counter is incremented first. Whenever the unary portion of the counter reaches a predetermined value, the binary portion of the counter is incremented. Since the unary portion of the counter only uses 1 to 0 bit transitions every n increments, the number of increments that cause a bit transition from 1 to 0 is reduced. Since a portion of the counter uses binary, a space savings is achieved. In one embodiment of the invention, a method is provided for choosing values for m and n in the memory.

In other embodiments, other techniques for reducing bit transitions from 1 to 0 are used.

Other features of the invention are described below.

BRIEF DESCRIPTION OF THE DRAWINGS

The system and methods for implementing a counter in accordance with the present invention are further described with reference to the accompanying drawings in which.

DETAILED DESCRIPTION OF THE INVENTION

Overview

A counter is provided in a memory of m+n bits. These bits are grouped into a binary portion of the counter of m bits and a unary portion of the counter of n bits. In order to increment the counter, the unary portion of the counter is incremented. When the unary portion of the counter reaches a specific value, the binary portion of the counter is incremented. Since the unary portion of the counter only uses 1 to 0 bit transitions every n increments, the number of increments that cause a bit transition from 1 to 0 is reduced. Since a portion of the counter is binary, a space savings is achieved.

Other counter configurations are also possible. For example, using alternate increment techniques may also reduce 1 to 0 bit transitions. A counter of p bits which counts from 0 to p−1 (p increments) in unary, then sets all but the first bit to 1, and counts from p to 2p−2 (p−1 increments) in unary with the rest of the bits, then sets all but the first two bits to 1 and counts from 2p−1 to 3p−4 (p−2 increments) in unary with the rest of the bits, etc., reduces bit transitions significantly.

Generally, according to the systems and methods of the invention, counters are provided using increment techniques to lower the number of 1 to 0 bit transitions per counter or per cell in a counter divided among a number of cells.

Exemplary Computing Environment

Figure 1:
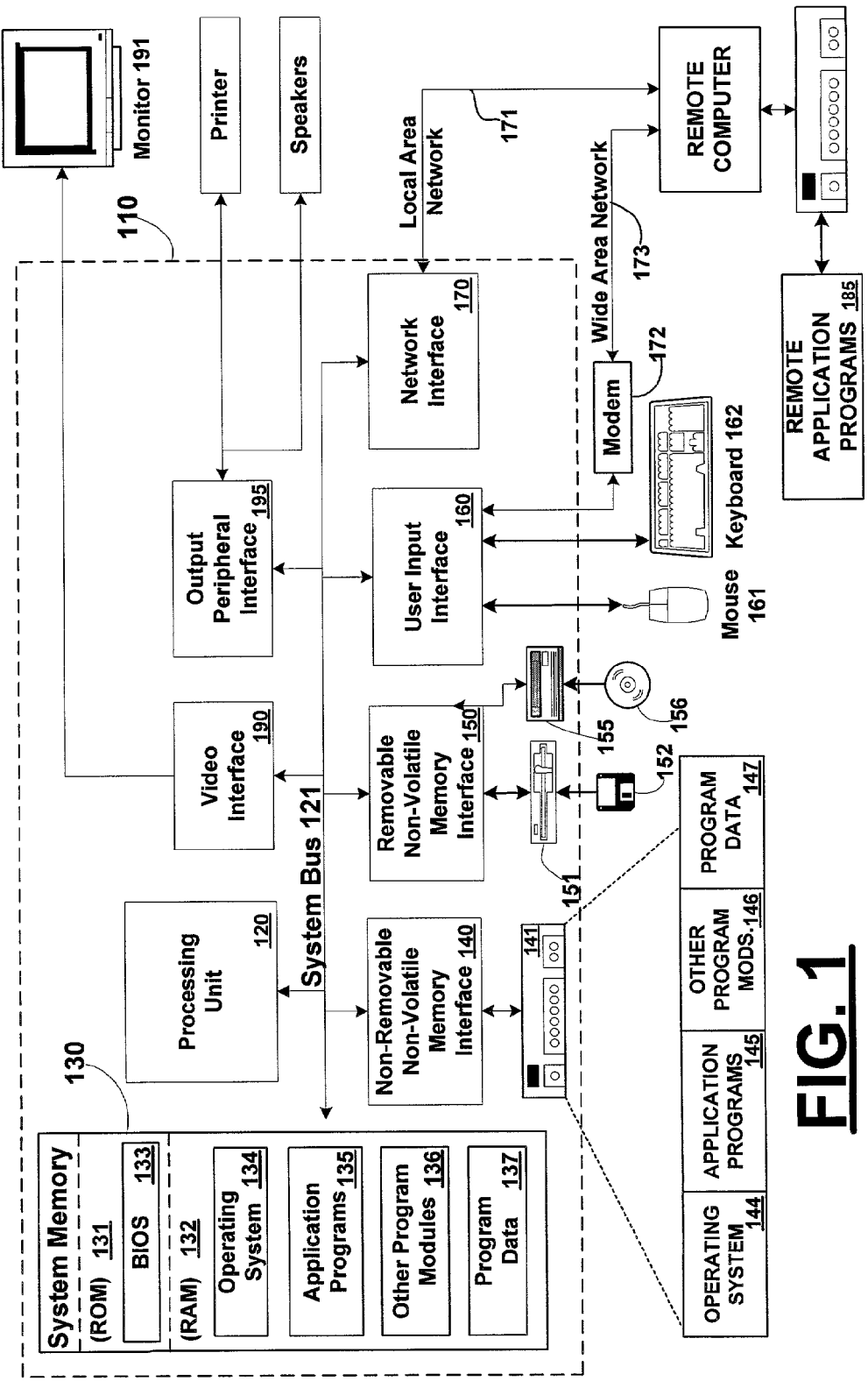
FIG. 1 is a block diagram of an exemplary computing environment in which aspects of the invention may be implemented.

FIG. 1 illustrates an example of a suitable computing system environment 100 in which the invention may be implemented. The computing system environment 100 is only one example of a suitable computing environment and is not intended to suggest any limitation as to the scope of use or functionality of the invention. Neither should the computing environment 100 be interpreted as having any dependency or requirement relating to any one or combination of components illustrated in the exemplary operating environment 100.

One of ordinary skill in the art can appreciate that a computer or other client or server device can be deployed as part of a computer network, or in a distributed computing environment. In this regard, the present invention pertains to any computer system having any number of memory or storage units, and any number of applications and processes occurring across any number of storage units or volumes, which may be used in connection with the present invention. The present invention may apply to an environment with server computers and client computers deployed in a network environment or distributed computing environment, having remote or local storage. The present invention may also be applied to standalone computing devices, having programming language functionality, interpretation and execution capabilities for generating, receiving and transmitting information in connection with remote or local services.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The invention may be described in the general context of computer-executable instructions, such as program modules, being executed by a computer. Generally, program modules include routines, programs, objects, components, data structures, etc. that perform particular tasks or implement particular abstract data types. The invention may also be practiced in distributed computing environments where tasks are performed by remote processing devices that are linked through a communications network or other data transmission medium. In a distributed computing environment, program modules and other data may be located in both local and remote computer storage media including memory storage devices. Distributed computing facilitates sharing of computer resources and services by direct exchange between computing devices and systems. These resources and services include the exchange of information, cache storage, and disk storage for files. Distributed computing takes advantage of network connectivity, allowing clients to leverage their collective power to benefit the entire enterprise. In this regard, a variety of devices may have applications, objects or resources that may utilize the techniques of the present invention.

With reference to FIG. 1, an exemplary system for implementing the invention includes a general-purpose computing device in the form of a computer 110. Components of computer 110 may include, but are not limited to, a processing unit 120, a system memory 130, and a system bus 121 that couples various system components including the system memory to the processing unit 120. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium that can be used to store the desired information and that can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 141 is typically connected to the system bus 121 through an non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 190.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet.

When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are exemplary and other means of establishing a communications link between the computers may be used.

Counters Using Reduced Number of 1 to 0 Bit Transitions

According to one embodiment of the present invention, a counter implemented in flash memory will use a counter increment function that reduces the bit transitions from 1 to 0. This will reduce the number of times the flash memory to need to be erased and rewritten and thereby increase the life of the counter. In one embodiment, the counter is implemented in a number of cells of flash memory that are separately erasable and rewritable. In this case, the counter increment function used should reduce the number of times separate flash memory cells are rewritten.

Embodiment Using Unary and Binary Portions

In order to implement the counter with a reduced number of bit transitions, in one embodiment, a counter with a unary portion and a binary portion is created.

Using unary counting instead of binary counting reduces the number of bit transitions from 1 to 0. Unary counting is a simple method of counting, which is illustrated in Table 1:

TABLE 1

Unary Counting from 0 to 15

| decimal | unary equivalent |
|---|---|
| 0 | 000000000000000 |
| 1 | 000000000000001 |
| 2 | 000000000000011 |
| 3 | 000000000000111 |
| 4 | 000000000001111 |
| 5 | 000000000011111 |
| 6 | 000000000111111 |
| 7 | 000000001111111 |
| 8 | 000000011111111 |
| 9 | 000000111111111 |
| 10 | 000001111111111 |
| 11 | 000011111111111 |
| 12 | 000111111111111 |
| 13 | 001111111111111 |
| 14 | 011111111111111 |
| 15 | 111111111111111 |

As can be seen in Table 1, this method of counting is space intensive. In counting from 0 to 15, 15 bits are used. However, no bit transitions from 1 to 0 occur. In general, to count from 0 to n, n bits are used and zero bit transitions from 1 to 0 occur. Counting in binary is not as space intensive, as illustrated in Table 2:

TABLE 2

Binary Counting from 0 to 15

| decimal | binary equivalent |
|---|---|
| 0 | 0000 |
| 1 | 0001 |
| 2 | 0010 |
| 3 | 0011 |
| 4 | 0100 |
| 5 | 0101 |
| 6 | 0110 |
| 7 | 0111 |
| 8 | 1000 |
| 9 | 1001 |
| 10 | 1010 |
| 11 | 1011 |
| 12 | 1100 |
| 13 | 1101 |
| 14 | 1110 |
| 15 | 1111 |

In binary, the numbers from 0 to 15 can be represented in 4 bits. However, a bit transition from 1 to 0 occurs every other increment. In general, m bits can represent $2^m$ values.

Figure 2:
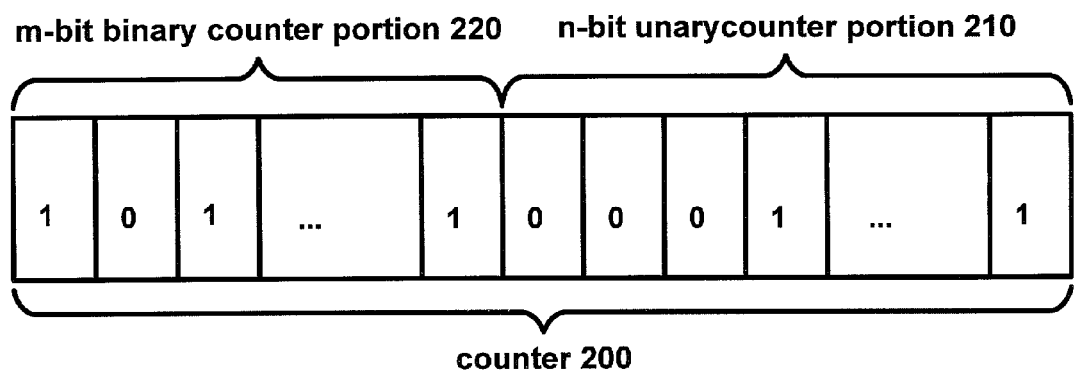
FIG. 2 is a block diagram showing a counter according to one embodiment of the invention.

According to the inventive technique, and as shown in FIG. 2, a counter 200 is provided in a memory of size n+m. In a preferred embodiment, the memory is a single memory unit. In alternate embodiments, the memory may be comprised of a number of memory units. The memory is divided into two portions, a unary portion of the counter 210 of n bits and a binary portion of the counter 220 of m bits. In a preferred embodiment, the n lowest-significant bits comprise the unary portion of the counter, and the m highest-significant bits comprise the binary portion of the counter. However, other arrangements of the bit groupings are contemplated in other embodiments of the invention. In one embodiment, the m lowest-significant bits comprise the binary portion of the counter and the n highest-significant bits comprise the unary portion of the counter. In one embodiment, the bits comprising each counter are not found consecutively in the counter.

Additionally, the invention has been described with reference to unary increment as the increment method for the first part of the counter and binary increment as the increment method for the second part. However, in alternate embodiments of the invention, any other increment method can be used for the first and second parts of the counter. In order to provide the benefits of the invention, the increment method for the first counter part must make fewer 1 to 0 bit transitions per increment (on average) than the increment method for the second part.

Calculation of the Counter Value

In one embodiment, in order to read the value of the counter, the binary portion 220 and the unary portion 210 of the counter are read. The value stored in the binary portion 220 multiplied by n+1. The value stored in the unary portion 210 is then read. The sum of these two values is the value stored in the counter can be determined. According to this embodiment of the invention, values for a counter where the first three bits of the counter store the binary portion and the last four bits of the counter store the unary portion are shown in Table 3:

TABLE 3

Example of Counter and Counter Values

| counter | value |
| --- | --- |
| 000 0000 | 0 |
| 000 0001 | 1 |
| 000 0011 | 2 |
| 000 0111 | 3 |
| 000 1111 | 4 |
| 001 0000 | 5 |
| 001 0001 | 6 |
| 001 0011 | 7 |
| 001 0111 | 8 |
| 001 1111 | 9 |
| 010 0000 | 10 |
| 010 0001 | 11 |
| 010 0011 | 12 |
| 010 0111 | 13 |
| 010 1111 | 14 |
| 011 0000 | 15 |
| 011 0001 | 16 |
| 011 0011 | 17 |
| 011 0111 | 18 |
| 011 1111 | 19 |
| 100 0000 | 20 |
| 100 0001 | 21 |
| 100 0011 | 22 |
| 100 0111 | 23 |
| 100 1111 | 24 |
| 101 0000 | 25 |
| 101 0001 | 26 |
| 101 0011 | 27 |
| 101 0111 | 28 |
| 101 1111 | 29 |
| 110 0000 | 30 |
| 110 0001 | 31 |
| 110 0011 | 32 |
| 110 0111 | 33 |
| 110 1111 | 34 |
| 111 0000 | 35 |
| 111 0001 | 36 |
| 111 0011 | 37 |
| 111 0111 | 38 |
| 111 1111 | 39 |

Incrementing the Counter

Figure 3:
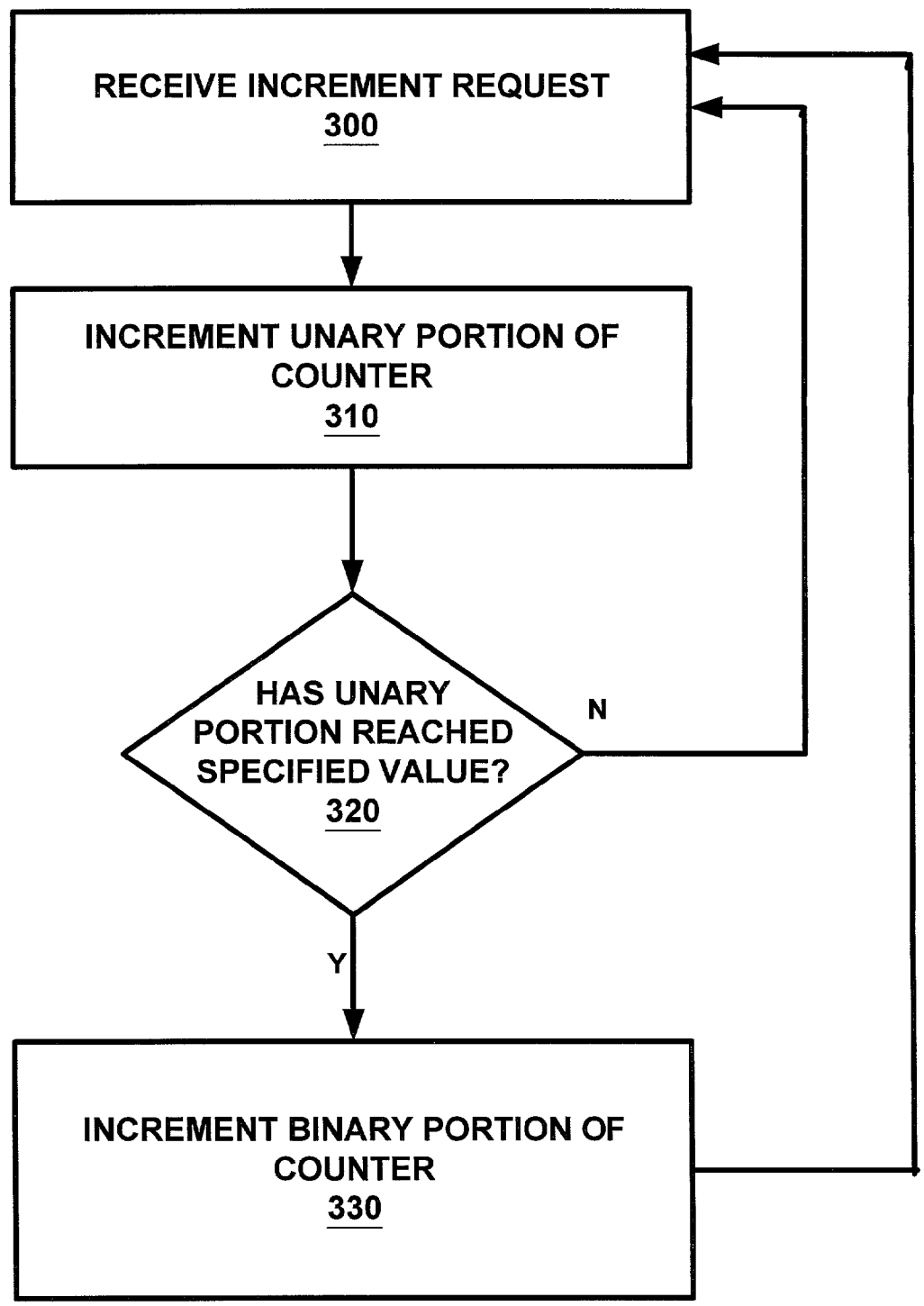
FIG. 3 is a flow diagram showing the use of the counter according to one embodiment of the invention.

As shown in FIG. 3, the counter receives a request for an increment 300. The counter then increments the unary portion of the counter 310. In a preferred embodiment of the invention, this increment is unary increment, modulo n+1, so that an increment to a unary portion in which all bits are 1 results in all bits being set to 0. If the unary portion of the counter has reached a specified value (decision step 320), then the binary portion of the counter is incremented 330. In a preferred embodiment of the invention, this increment is a binary increment modulo $2^m$, so that an increment to a binary portion in which all bits are 1 results in all for the unary portion of the counter triggering the binary increment is zero.

Calculation of Values for m and n

In some applications, it is desirable for the counter to last only through one cycle of all the possible value of the counters. This may be because the counter is being used for security purposes and duplicate values are disfavored.

The predicted lifespan of the counter may be measured in terms of bit transitions from 1 to 0. This would happen, for example, in the case of flash memory. If the binary portion of the counter is incremented upon rollover of the unary portion of the counter, then bit transitions will only occur every n increments. Therefore, where the lifespan of the counter is c bit transitions from 1 to 0, the number of increments that can occur during the lifespan is c*n.

At the same time, the number of values that can be represented by the counter is equal to the number of values that can be represented by the binary portion of the counter multiplied by the number of values that can be represented by the unary portion of the counter. The binary portion of the counter can represent $2^m$ numbers, since it represents all values from 0 through $2^m-1$. The unary portion of the counter can represent n+1 numbers, since it represents all values from 0 through n. Therefore, the total number of values that can be represented is $2^m(n+1)$.

In order to produce a counter that has an expected lifespan equal to one cycle of all the possible values, then the user should choose values for m and n such that $c*n \approx 2^m(n+1)$.

Alternate Counter Increment Function

Another embodiment of the invention in which a counter increment function reduces bit transitions from 1 to 0 uses a different counter increment function. In this function, the counter is successively divided into two unary counters which change sizes as the counter is incremented. For a counter of p bits, first, the counter counts from 0 to p−1 in unary using the last p−1 bits and stores a 0 in bit p. When the counter reaches p−1, to increment the counter, bit p becomes a one bit unary counter, bit p−1 becomes a one bit separator, and bits 1 through p−2 become a unary counter. When the counter then counts from p to 2p−2. When the counter reaches 2p−2, to increment the counter, bits p and p−1 become a two bit unary counter, bit p−2 becomes a one bit separator, and bits 1 through p−3 become a unary counter. This proceeds until the separator is bit 2. (p+2)(p−1)/2 unique values may be counted on this counter. Another embodiment adds into the pattern a count where all the bits are set to 1, and in that embodiment, (p+2)(p−1)/2+1 unique values may be represented, with only p−2 instances of erasure of the counters.

For p=7, this method is illustrated in Table 4, where the separator bit is indicated in bold:

TABLE 4

Example of Dynamically Sized Unary Counter Increment and Values

| counter | value |
|---|---|
| 0000000 | 0 |
| 0000001 | 1 |
| 0000011 | 2 |
| 0000111 | 3 |
| 0001111 | 4 |
| 0011111 | 5 |
| 0111111 | 6 |
| 1000000 | 7 |
| 1000001 | 8 |
| 1000011 | 9 |
| 1000111 | 10 |
| 1001111 | 11 |
| 1011111 | 12 |
| 1100000 | 13 |
| 1100001 | 14 |
| 1100011 | 15 |
| 1100111 | 16 |
| 1101111 | 17 |
| 1110000 | 18 |
| 1110001 | 19 |
| 1110011 | 20 |
| 1110111 | 21 |
| 1111000 | 22 |
| 1111001 | 23 |
| 1111011 | 24 |
| 1111100 | 25 |
| 1111101 | 26 |

This is another embodiment of an increment scheme that minimizes 0 to 1 transitions. Additionally, as the unary counter on the left of the counter grows, bits included in that counter portion will only transition from 1 to 0 one time.

Figure 4:
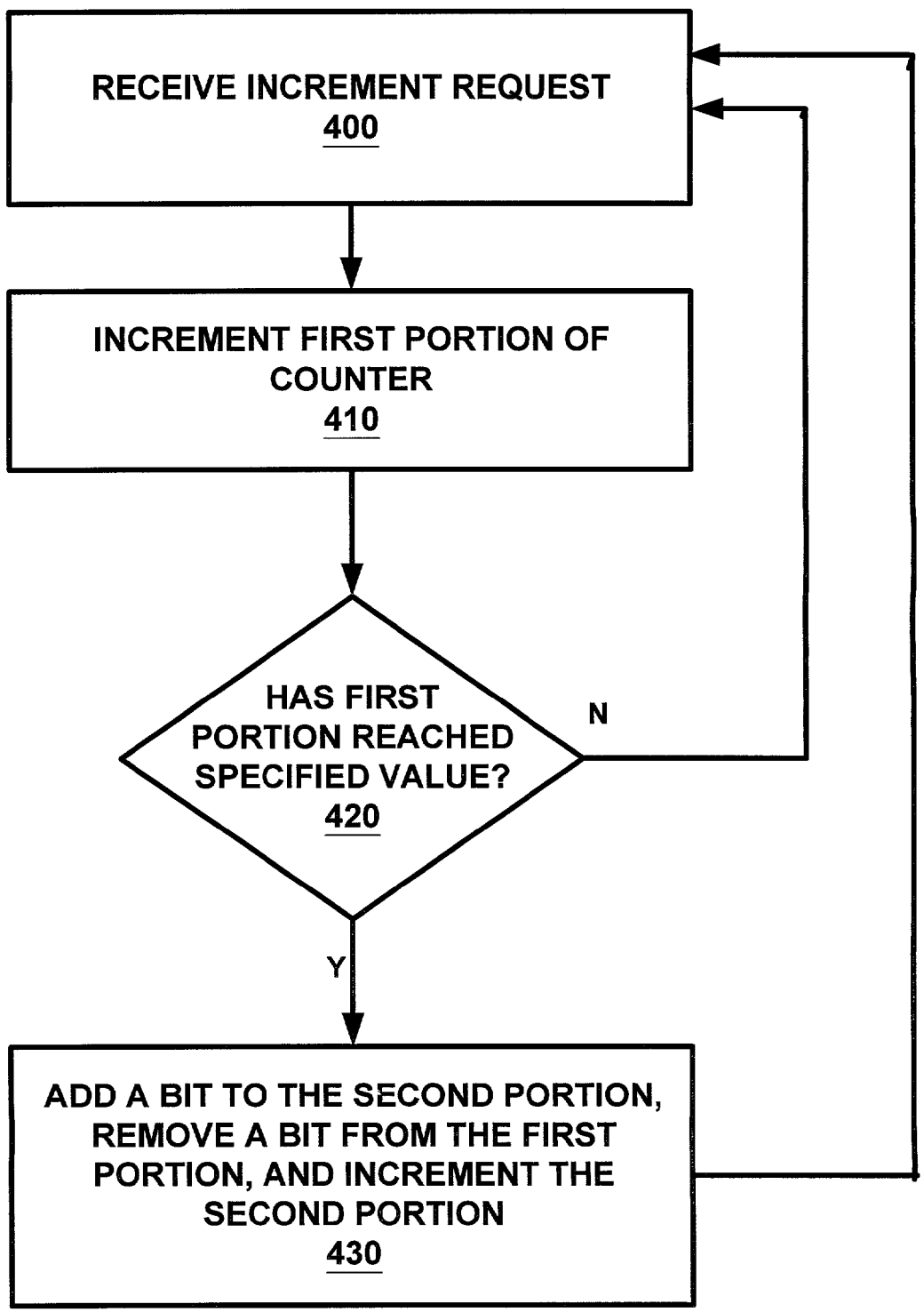
FIG. 4 is a flow diagram showing the use of a counter according to an embodiment of the invention.

As shown in FIG. 4, in step 400, an increment request is received. In step 410, the first counter is incremented. In step 420, it is determined whether the first portion of the counter has reached a specified value. If it has not, the method waits for a new increment request. If, however, the first portion of the counter has reached a specified value, a bit is added to the second portion of the counter, a bit is removed from the first portion of the counter, and the second portion of the counter is incremented 430. The increments for each portion happen simultaneously—when a new counter value has been determined, including a new value for both portions of the counter, if necessary, only then is the new value written into the memory which holds the counter.

If this scheme is used in a flash memory counter with more than one cell and the cells are assigned to represent different areas of the counter at different times, an improvement over the life of the flash memory may be realized. For example, the number of possible values may be divided by the number of cells of flash memory to determine transition counts, and the cells assigned a different portion of the counter at each transition count. In this way, bits on the right side of the counter, which must be erased and rewritten more often than those on the left side of the counter may be assigned to different cells, and the average life of the cells extended.

Determining Counter Expiration

If a flash cell is erased too often it becomes unreliable and write operations can cause unpredictable values to be written. In general, it is desirable that the users of the counter can determine if the counter has exceeded its lifetime, and is no longer be reliable. If the lifetime has a known lower bound for erasures, then the increment logic can simply refuse to increment beyond a certain value. Users of the counter can treat the ceiling value as evidence of counter expiration.

If counter lifetime is less deterministic or more precision is desired, in an alternate embodiment the increment operator can increment-then-read the counter value. If the counter value is not as expected, a separate "suspect" flag or bit that is associated with the counter can be set. Users of the counter can consult the "suspect" flag or bit to determine the trustworthiness of the currently reported value.

Conclusion

Herein a system and method for counter implementation. As mentioned above, while exemplary embodiments of the present invention have been described in connection with various computing devices and network architectures, the underlying concepts may be applied to any computing device or system in which it is desirable to create a counter. Thus, the techniques for creating a counter in accordance with the present invention may be applied to a variety of applications and devices. For instance, the techniques of the invention may be applied to the operating system of a computing device, provided as a separate object on the device, as part of another object, as a downloadable object from a server, as a "middle man" between a device or object and the network, as a distributed object, etc. While exemplary names and examples are chosen herein as representative of various choices, these names and examples are not intended to be limiting.

The various techniques described herein may be implemented in connection with hardware or software or, where appropriate, with a combination of both. Thus, the methods and apparatus of the present invention, or certain aspects or portions thereof, may take the form of program code (i.e., instructions) embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. In the case of program code execution on programmable computers, the computing device will generally include a processor, a storage medium readable by the processor (including volatile and non-volatile memory and/or storage elements), at least one input device, and at least one output device. One or more programs that may utilize the techniques of the present invention, e.g., through the use of a data processing API or the like, are preferably implemented in a high level procedural or object oriented programming language to communicate with a computer system. However, the program(s) can be implemented in assembly or machine language, if desired. In any case, the language may be a compiled or interpreted language, and combined with hardware implementations.

The methods and apparatus of the present invention may also be practiced via communications embodied in the form of program code that is transmitted over some transmission medium, such as over electrical wiring or cabling, through fiber optics, or via any other form of transmission, wherein, when the program code is received and loaded into and executed by a machine, such as an EPROM, a gate array, a programmable logic device (PLD), a client computer, a video recorder or the like, or a receiving machine having the signal processing capabilities as described in exemplary embodiments above becomes an apparatus for practicing the invention. When implemented on a general-purpose processor, the program code combines with the processor to provide a unique apparatus that operates to invoke the functionality of the present invention. Additionally, any storage techniques used in connection with the present invention may invariably be a combination of hardware and software.

While the present invention has been described in connection with the preferred embodiments of the various figures, it is to be understood that other similar embodiments may be used or modifications and additions may be made to the described embodiment for performing the same function of the present invention without deviating therefrom. For example, while exemplary network environments of the invention are described in the context of a networked environment, such as a peer to peer networked environment, one skilled in the art will recognize that the present invention is not limited thereto, and that the methods, as described in the present application may apply to any computing device or environment, such as a gaming console, handheld computer, portable computer, etc., whether wired or wireless, and may be applied to any number of such computing devices connected via a communications network, and interacting across the network. Furthermore, it should be emphasized that a variety of computer platforms, including handheld device operating systems and other application specific operating systems are contemplated, especially as the number of wireless networked devices continues to proliferate. Still further, the present invention may be implemented in or across a plurality of processing chips or devices, and storage may similarly be effected across a plurality of devices. Therefore, the present invention should not be limited to any single embodiment, but rather should be construed in breadth and scope in accordance with the appended claims.

What is claimed is:

1. A method of implementing a counter, where the bits of said counter are dynamically divided into subsets, comprising a first subset of bits storing a first value and a second subset of bits storing a second value, and where an increment method minimizes bit transitions from one to zero, said method comprising:
   receiving a request to increment said counter;
   incrementing said first value according to said increment method in response to said receipt of said increment request;
   adding a bit to said second subset of bits, reducing the size of said first subset of bits by at least one bit, and incrementing said second value according to said increment method when said first value is equal to a specified value.

2. The method of claim 1, where said increment method is unary increment.

3. The method of claim 1, where said counter is implemented in flash memory.

4. The method of claim 1, where said specified value is equal to zero.

5. A computer device for implementing a counter, where an increment method minimizes bit transitions from one to zero, said device comprising:
   a counter comprising bits dynamically divided into subsets, comprising a first subset of bits storing a first value and a second subset of bits storing a second value;
   a first counter incrementer that increments said first value according to said increment method in response to said receipt of an increment request;
   a second counter incrementer that adds a bit to said second subset of bits, reduces the size of said first subset of bits by at least one bit, and increments said second value according to said increment method when said first value is equal to a specified value.

6. The method of claim 5, where said increment method is unary increment.

7. The method of claim 5, where said counter is implemented in flash memory.

8. The method of claim 5, where said specified value is equal to zero.

9. A computer-readable medium comprising computer-executable modules having computer-executable instructions for implementing a counter, where said counter comprises bits dynamically divided into subsets, comprising a first subset of bits storing a first value and a second subset of bits storing a second value, and where an increment method minimizes bit transitions from one to zero, said modules comprising:
   a module for receiving a request to increment said counter;
   a module for incrementing said first value according to said increment method in response to said receipt of an increment request;
   a module for adding a bit to said second subset of bits, reducing the size of said first subset of bits by at least one bit, and incrementing said second value according to said increment method when said first value is equal to a specified value.

10. The computer-readable medium of claim 9, where said increment method is unary increment.

11. The computer-readable medium of claim 9, where said counter is implemented in flash memory.

12. The computer-readable medium of claim 9, where said specified value is equal to zero.

* * * * *